(12) United States Patent
Ono et al.

(10) Patent No.: US 8,063,542 B2
(45) Date of Patent: Nov. 22, 2011

(54) PIEZOELECTRIC DEVICES AND METHODS FOR MANUFACTURING SAME

(75) Inventors: Kozo Ono, Saitama (JP); Takahiro Inoue, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 5 days.

(21) Appl. No.: 12/237,301

(22) Filed: Sep. 24, 2008

(65) Prior Publication Data

US 2009/0085431 A1  Apr. 2, 2009

(30) Foreign Application Priority Data

Sep. 27, 2007 (JP) ................. 2007-251821

(51) Int. Cl.
  *H01L 23/08* (2006.01)
  *H01L 41/08* (2006.01)
(52) U.S. Cl. ........................ 310/348; 310/344
(58) Field of Classification Search .................. 310/351, 310/352, 358, 340, 344, 363, 317; *H10L 23/08; H03H 9/02*
See application file for complete search history.

(56) References Cited

U.S. PATENT DOCUMENTS 4,065,684 A * 12/1977 Hermann et al. ............. 310/351
4,639,631 A * 1/1987 Chason et al. ................ 310/348

FOREIGN PATENT DOCUMENTS

JP      2003-158439      5/2003

* cited by examiner

*Primary Examiner* — Thomas Dougherty
*Assistant Examiner* — Karen B Addison
(74) *Attorney, Agent, or Firm* — Klarquist Sparkman, LLP

(57) ABSTRACT

Devices are disclosed that include a piezoelectric vibrating piece; a glass base and lid form a package enclosing the piezoelectric vibrating piece. The piece has first and second electrodes. The base has first and second opposing surfaces. The base mounts the piezoelectric vibrating piece, and the lid seals the piezoelectric vibrating piece in the package. The base includes first and second metal wires, extending therethrough, whose ends are denuded to the first and second surfaces and connected to the first and second electrodes, respectively. In disclosed methods for making the packaged devices, such as piezoelectric oscillators, multiple packaged devices are made simultaneously by stacking and simultaneously bonding respective wafers on which glass bases, piezoelectric vibrating pieces, and lids have been formed.

12 Claims, 11 Drawing Sheets

PIEZOELECTRIC DEVICES AND METHODS FOR MANUFACTURING SAME

CROSS-REFERENCE TO RELATED PATENT APPLICATION

This application claims priority to, and the benefit of, Japan Patent Application No. 2007-251821, filed on Sep. 27, 2007, in the Japan Patent Office, the disclosure of which is incorporated herein by reference in its entirety.

FIELD

This disclosure relates to, inter alia, piezoelectric devices of which the package is formed from a glass wafer with embedded metal wires. The disclosure also pertains to methods for manufacturing piezoelectric devices, including sealing of piezoelectric vibrating pieces in their respective packages.

DESCRIPTION OF THE RELATED ART

With the progress of miniaturization and/or increases in the operating frequency of mobile communication apparatus and office automation (OA) equipment, piezoelectric oscillators used in this equipment must be progressively smaller and/or operate at higher frequency. Also required are piezoelectric oscillators that can be surface mounted on circuit boards.

Contemporary piezoelectric oscillators comprise piezoelectric vibrating pieces sealed in respective device packages, wherein the piezoelectric vibrating piece is connected to electrodes in the package. Generally, the package is made of ceramic, and defines a predetermined interior volume to contain the piezoelectric vibrating piece. At the bottom of the package, holes are formed through a bottom portion of the package, and the through-holes are sealed with solder.

Example package-sealing techniques using a ceramic package are discussed in Japan Unexamined Patent Publication No. 2003-158439, in which a first adhesive such as a brazing filler metal is applied on the top of the package. The brazing filler metal is melted in a heat chamber with application of pressure to bond the package. Then, a sealing material such as high-temperature solder is applied to the through-holes in a vacuum or inert-gas environment. The package is sealed by irradiating the high-temperature solder with a laser beam.

Further regarding the sealing method discussed in Japan Unexamined Patent Publication No. 2003-158439, the package-sealing material is inserted in the through-holes formed on the bottom of the package, and the through-holes are sealed by melting the sealing material using laser light. However, this sealing must be performed individually with each piezoelectric vibrating piece being packaged on an assembly line. Hence, mass-production (with consequent item cost reduction) is difficult.

The shortcomings of conventional methods summarized above are addressed by methods and devices as disclosed herein, in which a wafer of low-melting-point glass is formed by casting the glass in a mold in which metal wires having low electrical resistance are arranged at designated positions. After casting the glass is cooled, removed from the mold, and sliced to form the glass wafers with embedded lead lines formed from the metal wires. On the sliced wafers are formed multiple package pieces (notably package bases) each with respective embedded wires for use in packaging piezoelectric vibrating pieces.

SUMMARY

A piezoelectric device of a first aspect comprises a piezoelectric vibrating piece having first and second electrodes. The piezoelectric vibrating piece is sandwiched between and sealed to a glass base below and a lid above. The glass base has a first surface and an opposing second surface. The first surface is an interior surface of the piezoelectric device, and the second surface is an exterior (lower) surface. The glass base also has at least first and second metal wires extending through the glass base and extending from the first and second surfaces. The extending ends of the wires are denuded to the first and second surfaces. The ends denuded to the first surface are connected to the first and second electrodes when the glass base is attached to the piezoelectric vibrating piece. The first and second metal wires extend through the glass base and are inherently sealed to the glass base. (Sealing of the wires to the glass desirably is achieved by casting the glass, in a molten condition, around the wires.) The wires sealed to the glass base eliminate a need, with conventional bases, to perform a separate step to seal wires passing through the base, such as via through-holes. Thus, piezoelectric devices can be manufactured at lower cost than conventionally.

The glass base of the piezoelectric device desirably includes respective connection electrodes on its second surface that are connected to the first and second wires, respectively. Thus, each of the connection electrodes is connected surely to the first and second electrode patterns without any contact failure.

The metal wires can be made of any of various suitable metals such as, but not limited to, iron (Fe), copper (Cu), nickel (Ni), stainless (SUS), or kovar alloy. These metals are relatively inexpensive and have superior electrical conductivity. The wires desirably are coated with a metal such as gold (Au). The gold layer on the metal wires increases the affinity of the wires to glass and improves the electrical conductivity of the wires through the glass base. Gold also improves connection of the wires to the respective connection electrodes. The surface roughness of the wires can be increased to increase the affinity of the wires to the glass of the base. The gold layer can be formed after increasing the surface roughness of the wires.

According to another aspect, methods for manufacturing piezoelectric devices are provided. An embodiment of such a method comprises preparing a lid wafer on which is formed an array of multiple lids, preparing a piezoelectric wafer on which is formed an array of multiple piezoelectric vibrating pieces each having a first electrode and a second electrode, and preparing a glass base wafer on which is defined an array of multiple bases. The glass base wafer has a first surface and an opposing second surface. Each base includes at least a first metal wire and a second metal wire extending through the base and having respective ends denuded to the first surface. The method includes the step of sandwiching the piezoelectric wafer between the lid wafer and the glass base wafer in a manner resulting in registration of each piezoelectric vibrating piece with a respective base and a respective lid. The wafers are bonded together in a manner resulting in bonding each of the piezoelectric vibrating pieces to a respective lid and respective base, and automatic connection of the denuded metal wire-ends on the first surface of the base to the first and second electrode patterns of the piezoelectric vibrating piece. The resulting multiple piezoelectric devices are then cut or otherwise detached from the bonded three-layered wafer. According to this method embodiment, assembly and sealing of individual piezoelectric devices as performed in conventional methods are avoided because multiple piezoelectric devices are made simultaneously by performing all process steps at the wafer level. This allows piezoelectric devices to be manufactured at lower cost than conventionally.

In the method, the step of preparing the glass base wafer can include the steps of arranging the first and second metal wires substantially parallel to each other at a designated spacing in a mold; fusing glass fragments at a fusing temperature of 900 C or less; forming a glass block containing the first and second metal wires by pouring the fused glass into the mold around the wires and allowing the glass to harden; and slicing the glass block in a direction perpendicular to the metal wires to form glass wafers. By forming glass wafers in this manner, each having embedded wires, mass production of bases can be achieved. Bubbles in the glass of the glass block can be reduced by pouring the fused glass into the mold after fusing the glass fragments.

In an alternative embodiment, the step of preparing the glass base wafer can further comprise the steps of placing the glass fragments along with arranged wires (sufficient to provide at least first and second metal wires for each base), arranged substantially parallel to each other in a designated space in a mold; fusing the glass fragments in the mold at 900 C or less to form a glass block containing the metal wires; allowing the fused glass to harden to form a glass block; and slicing the glass block in a direction perpendicular to the metal wires to form glass wafers. Thus, this embodiment differs from the first method embodiment by forming a glass block, containing the metal wires, in the mold by pouring the glass fragments (rather than a glass melt) into the mold and heating the mold to a fusing temperature. The glass wafers are manufactured by slicing them from the block so that mass production of glass wafers can be achieved.

If desired, a glass film can be formed on the surfaces of the metal wires to confer high affinity of the wires to the fused glass. After forming the glass film on the wires, the wires are arranged in the mold at designated positions. Thus, the first and second metal wires for each piezoelectric device formed from the glass wafer are strongly bonded to their respective glass base. This allows bonding of the wafers to be performed in a vacuum so as to seal a vacuum environment inside each piezoelectric device. Maintenance of the vacuum is assured due to the absence of any space between the first and second wires and the glass base of each piezoelectric device.

As noted above, the surface roughness of the metal wires can be increased to increase the affinity of the wires to the fused glass. The roughened wires are arranged at their designated positions in the mold. The consequent strong bonding of the first and second metal wires to the respective bases allows processing in a vacuum to produce a vacuum environment inside each piezoelectric device.

DETAILED DESCRIPTION OF THE PREFERRED EMBODIMENTS

Crystal Units

Figure 1:
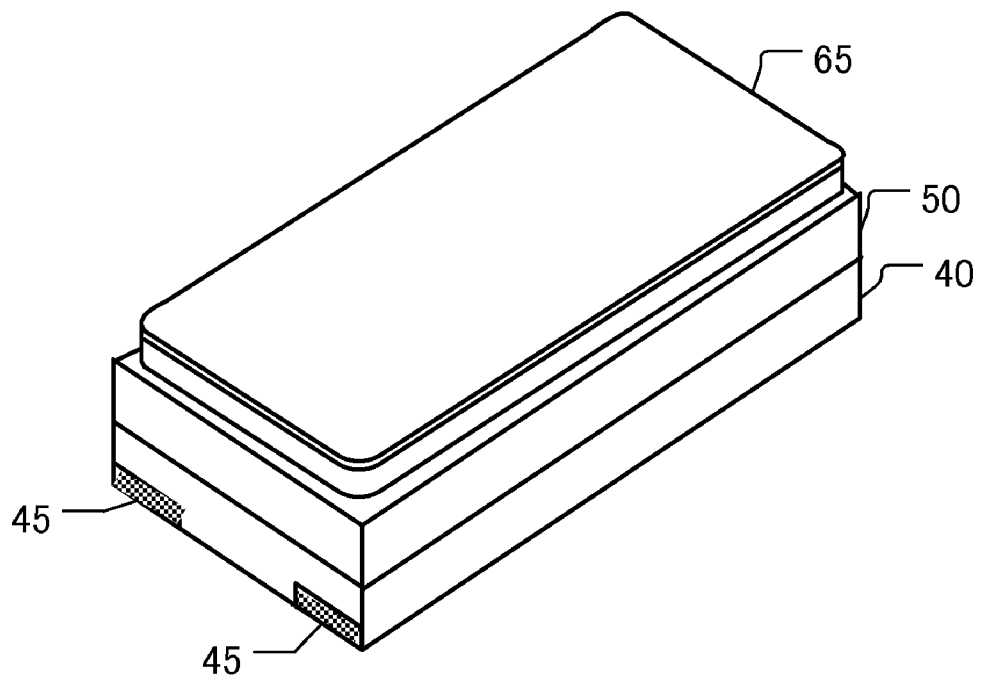
FIG. 1 is a schematic view of the exterior of the crystal unit of the first embodiment and the crystal unit of the second embodiment.

FIG. 1 is a schematic view of a first embodiment of a crystal unit 100 as an exemplary piezoelectric device. The crystal unit 100 is a surface-mountable piezoelectric device suitable for mounting to a printed base. The crystal unit 100 mainly comprises an insulating glass base 40, a crystal frame 50, and a glass lid 65. The crystal frame 50, the glass base 40, and the glass lid 65 are manufactured in wafer units to increase productivity. First, a base glass wafer 20 for the glass base 40 is described below.

Configuration of Base Glass Wafer

Figure 2A:
FIG. 2A is a schematic plan view of an embodiment of a base glass wafer.
Figure 2B:
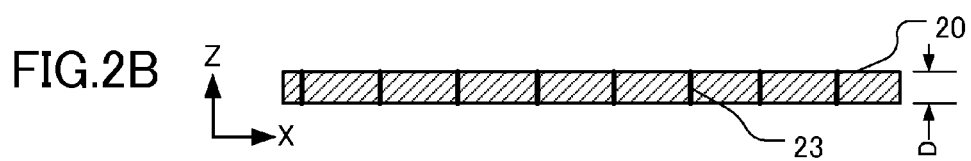
FIG. 2B is a cross-sectional view along the B-B line in FIG. 2A.
Figure 2C:
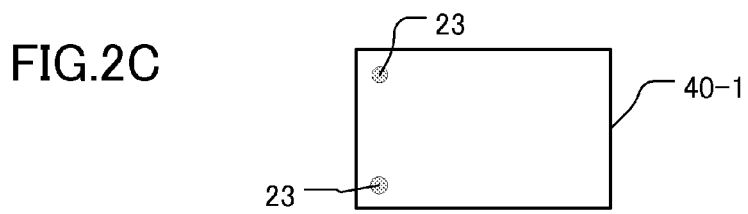
FIGS. 2C, 2D, and 2E are schematic plan views showing respective possible positions of metal wires in the base.
Figure 2D:
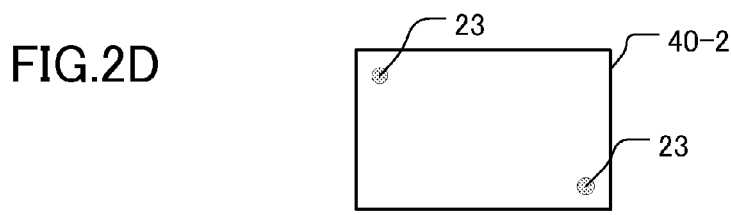
Figure 2E:
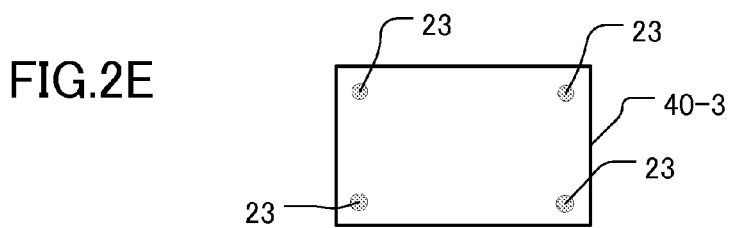

The base glass wafer 20 is described with reference to FIGS. 2A-2E. FIG. 2A is a plan view of the base glass wafer 20. FIG. 2B is a cross-sectional view along the line B-B in FIG. 2A. FIGS. 2C, 2D, and 2E are plan views of exemplary respective patterns of metal wires 23 formed in bases 40 cut from the wafer 20.

In FIG. 2A, metal wires 23 are arranged at designated positions and embedded in the base glass wafer 20. The metal wires 23 are comprised of nickel (Ni), stainless (SUS), iron (Fe), or kovar alloy (Fe, Ni, and Co). The base glass wafer 20 is sliced from a glass block 25, as explained later with reference to FIG. 3B. Ie., a method for manufacturing the base glass wafer 20 is described later with reference to FIGS. 3A and 3B.

In FIG. 2B the metal wires 23 pass through the thickness of the base glass wafer 20 from the front surface to the rear surface thereof. In the figure, the metal wires 23 extend in directions that are normal to the front and back surfaces. However, this is not intended to be limiting; the wires can extend through the wafer 20 at non-normal angles relative to the front and back surfaces. The thickness D of the base glass wafer 20 is established when the block is sliced using a saw, and usually ranges from 0.3 mm to 1.0 mm.

FIGS. 2C, 2D, and 2E show individual glass base units 40-1, 40-2, 40-3, respectively, with respective patterns of metal wires 23. On the type-A base 40-1 of FIG. 2C, two metal wires 23 are arranged near the left edge, with space between the wires and the adjacent edges. On the type-B base 40-2 of FIG. 2D, two metal wires 23 are arranged substantially along a diagonal (one wire in the upper left corner, and the other wire in the lower right corner), with space between the wires and the adjacent edges. On the type-C base 40-3 of FIG. 2E, a respective metal wire 23 is situated in each of the four corners, with space between the wires and the adjacent edges. These positions of the metal wires 23 on the bases depend upon the respective positions of electrodes, of the crystal vibrating pieces to be formed on the crystal frames 50, intended to be connected to the wires.

Figure 2F:
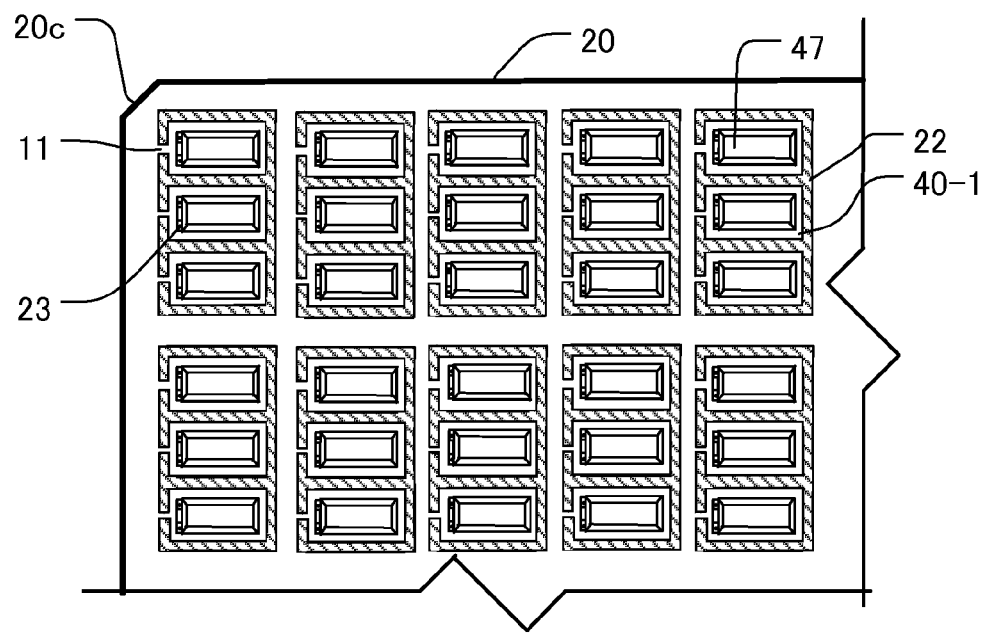
FIG. 2F is a plan view of a portion of a base glass wafer on which multiple bases are formed.

FIG. 2F is a plan view of a portion of the base glass wafer 20 on which multiple type-A bases 40-1 have been formed. In FIG. 2F the multiple type-A bases 40-1 have been formed, by etching, on the rectangular base glass wafer 20. The regions that are hatched are actually voids 22 formed in the base glass wafer 20 by etching, resulting in the formation of the bases 40-1 nearly surrounded by respective voids. In the central area of each of the type-A bases 40-1, a concave region 47 is formed by etching a selected depth into the glass of the base. The bases 40-1 are arranged in blocks of three in the figure, wherein each group is substantially surrounded by voids 22. Alternatively to forming surrounding voids 22, the bases 40 can be cut from the wafer 20 piece by piece using a dicing saw.

Further shown in FIG. 2F is an orientation flat 20c on one corner of the rectangular glass wafer 20. The orientation flat 20c provides a directional reference for orienting the bases 40. The bases 40 are connected to the glass wafer by narrow connection portions 11. Thus, multiple bases 40 can be handled and processed simultaneously as a single unit by processing the base glass wafer 20.

Manufacturing the Base Glass Wafer

Aspects of an embodiment of a process for manufacturing the base glass wafer 20, described above in connection with FIGS. 2A-2F, are now described with reference to FIGS. 3A-3C, which depict different views of an exemplary mold 70 used for forming a glass block 25 from which base glass wafers 20 are cut.

Figure 3A:
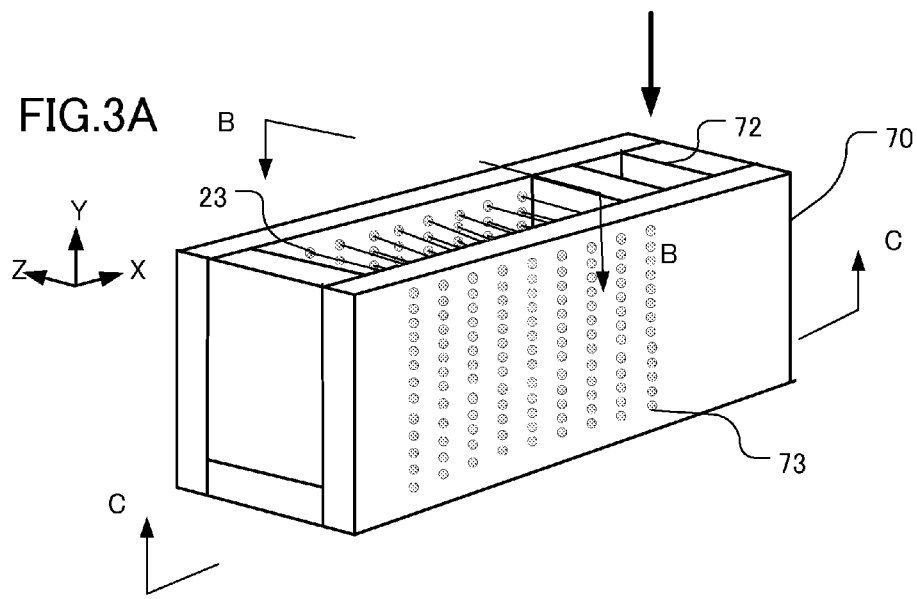
FIG. 3A is a schematic perspective view of a mold used for forming a glass block from which base glass wafers are obtained.

FIG. 3A is a perspective view of the mold 70 to form the glass block 25. The mold 70 is formed of machined plates of graphite assembled into a box. The mold 70 has a glass inlet 72 at one end, the inlet extending down the side of the mold 70. In the lateral plates of graphite are holes 73, in designated positions, in which metal wires 23 are inserted. The wires 23 extend across the inside of the mold to corresponding holes 73 in the opposing lateral plate. In the depicted mold, the holes 73 formed on the side surface are formed at the same positions on both X and Y surfaces. The interior of the mold 70 has a depth of 100 mm to 150 mm, a width of 20 mm to 50 mm, and a length of 100 mm to 150 mm. The metal wires 23 are pre-processed to have an affinity to glass to ensure good and close bonding of the wires to glass added to the mold.

If the wires 23 are made of copper wire, they are preprocessed by heating to 800 C and annealed to remove stresses, cooled, and soaked in a saturated aqueous solution of borax ($Na_2B_4O_7 \cdot 10H_2O$). The copper wire is heated again, to 900 C, resulting in formation of a borax glass ($Na_2B_4O_7$) coating on the surface of the copper wire.

If the metal wires 23 are made of nickel, stainless, iron, or kovar alloy, the surface of the wire is scabbled (roughened) by sandblasting to increase its roughness, and then washed. A layer of gold is formed on the wire by electroplating. The gold layer not only enhances the affinity of the wire for glass but also improves conductivity of the wire.

Figure 3B:
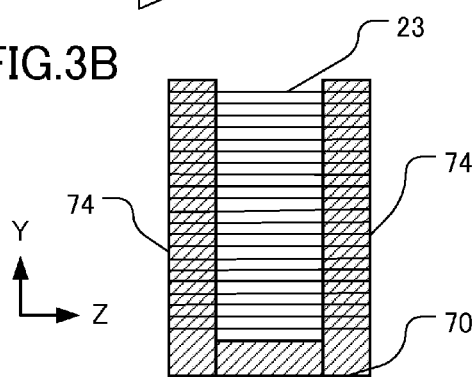
FIG. 3B is a cross-sectional view along the A-A line in FIG. 3A.

FIG. 3B is a cross-sectional view of the mold 70 along the line B-B of FIG. 3A. The wires 23 that have been preprocessed have been threaded through the holes 73, followed by application of graphite paste on the outer surface 74 of the mold. The graphite paste is cured by placing the mold 70 into a first electrical furnace, not shown.

Figure 3C:
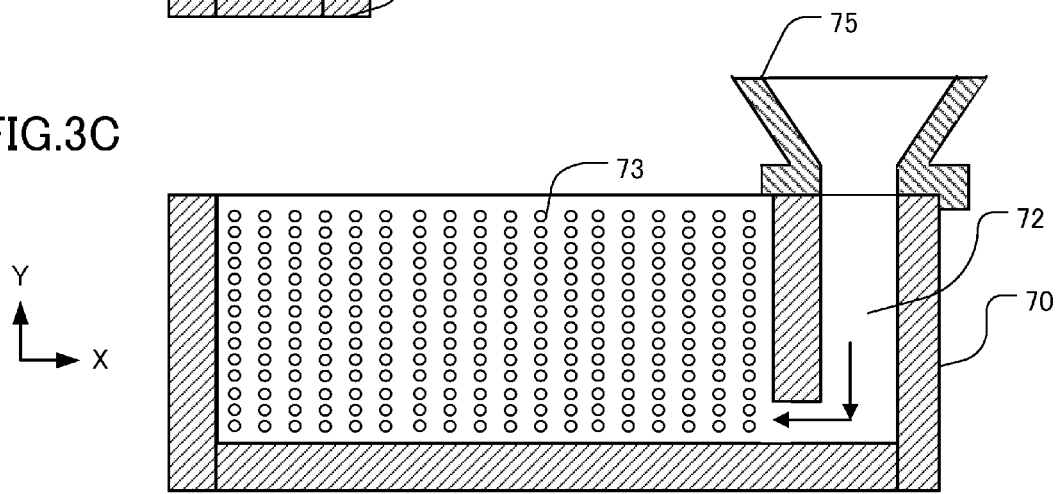
FIG. 3C is a cross-sectional view along the B-B line in FIG. 3A.

FIG. 3C is a cross-sectional view along the line C-C in FIG. 3A. FIG. 3C shows an inlet guide 75 attached to the glass inlet 72 of the mold 70. The inlet guide 75 is not fixed to the inlet 72 so that it is easy to remove from the mold. In this condition the mold 70 is placed in a second electrical furnace in which the mold is pre-heated to 650 C in preparation for receiving molten glass.

The molten glass desirably is prepared from 100% cullet of sodium borosilicate glass. The cullet is glass waste obtained by comminuting glass after fusion and cooling. In other processes, cullet is used to facilitate fusion of glass, wherein cullet having the same composition as the glass to be fused is mixed 20% to 50% to a glass formulation to cause fusion. For the present purposes, the glass for the block is made entirely of cullet of sodium borosilicate glass. To make molten glass, the cullet is added to a crucible, and the crucible is heated in the second electrical furnace. The crucible can be made of, for example, porcelain, graphite, or platinum.

The softening temperature of the cullet is about 65° C., which is less than the fusion temperature. The grain size of the cullet is 1-2 mm. Desirably, the cullet does not include significant amounts of fine glass powder because glass powder in the cullet causes, during fusion, persistent entrainment of bubbles that are very difficult to remove, and a glass block 25 containing entrained bubbles may be unsatisfactory for making glass wafers. In the second electrical furnace the crucible containing the cullet increases in temperature to 800 C, at which fusion begins, and then to 900 C at which the cullet is completely fused. It is important to control fusion temperature; if the cullet is fused at significantly greater than 900 C, then the metal of the wires (copper, nickel, stainless, iron, or kovar alloy) may become fused or the metal wires 23 may be broken when the molten glass is introduced to the mold.

During fusion of the cullet, it is desirable to allow bubbles to rise and dissipate. At the appropriate time, the crucible containing the fused glass is moved to the pre-heated mold 70, and the fused glass is poured gently into the mold 70 through the inlet guide 75 and the inlet 72. The fused glass moves in the directions indicated by the arrows in the inlet 72 (FIG. 3C) and fills the mold 70 from bottom to top with molten glass.

Figure 3D:
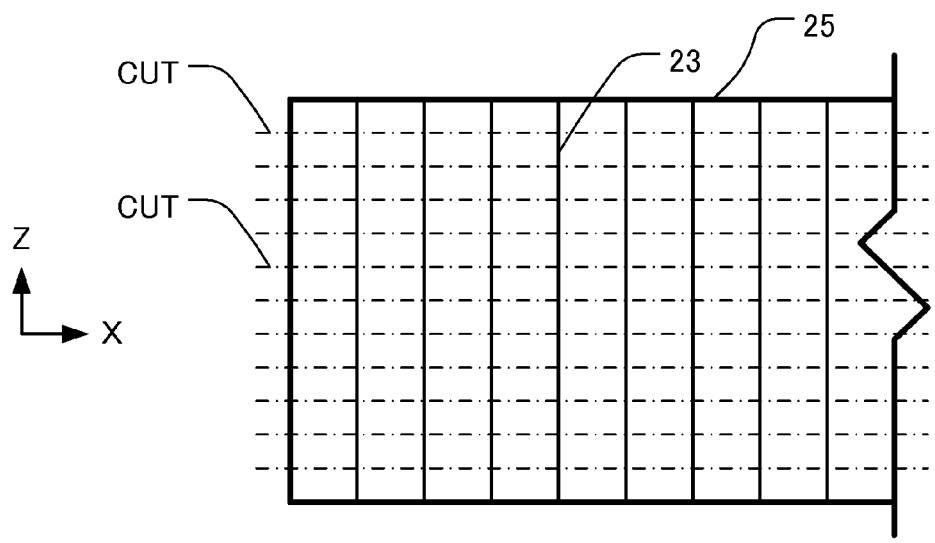
FIG. 3D is a top view of a portion of a glass block, showing wires and lines along which base glass wafers are cut from the block.
Figure 3E:
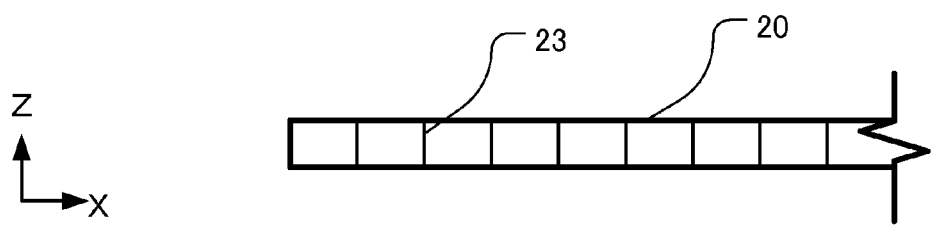
FIG. 3E is a top edge view of a base glass wafer.

FIGS. 3D and 3E schematically depict formation of the base glass wafer 20 from a glass block 25. FIG. 3D is a partial side elevational view of the glass block 25, and FIG. 3E is an edge view of a wafer that has been sliced from the block. The glass block 25 shown in FIG. 3D is cooled down in the first electrical furnace after the block is cast in the mold 70. Then, after cooling to approximately room temperature, the block is removed from the mold 70.

The glass block 25 is sliced using a slicing saw along the dotted lines denoted "CUT." FIG. 3E shows the edge of a sliced base glass wafer 20. On the front and back major surfaces of the base glass wafer 20 (as cut by the slicing saw), unevenness or flexure is usually evident. To remove unevenness or flexure, and to reveal the ends of the metal wires 23 on the surfaces of the base glass wafer 20, etching is performed on the "first and second surfaces" (front and rear major surfaces) of the wafer to reduce surface irregularities to 100-300 Ångstroms. Etching also exposes and denudes the ends of the metal wires 23 so that they extend slightly from the first and second surfaces of the base glass wafer 20 (see FIG. 2B).

As described, the glass block 25 is formed by pouring the fused glass, produced separately by fusing the cullet in the second electric furnace, into the mold 70. Alternatively, the cullet can be added to and fused in the mold 70 placed in the first electric furnace heated to 900 C. The alternative procedure eliminates having to transfer the fused glass into the mold. In the alternative procedure, bubbles must not be left in the glass block 25. Whenever anodic bonding is performed as shown in FIG. 4E, metal ions need to be added to the cullet. If the glass melt can be formed at a temperature that does not damage or melt the metal wires 23, any of various types of glass can be used.

First Embodiment of Crystal Unit

Figure 4A:
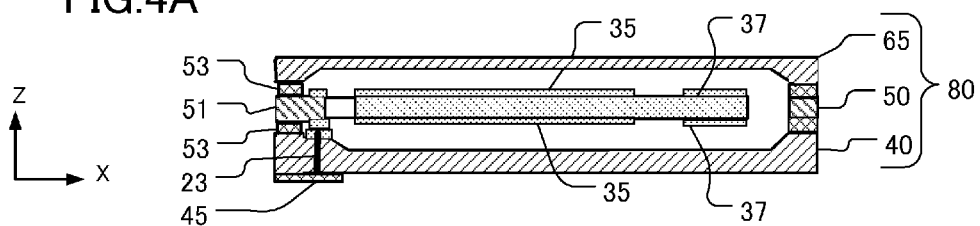
FIG. 4A is a schematic elevational section of a crystal unit according to a first embodiment, the section being along the line X-X in FIG. 4C.
Figure 4B:
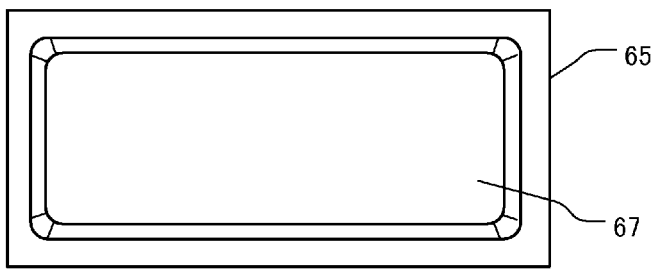
FIG. 4B is a plan view of the under-surface of a lid used for packaging, the lid including a concave region.
Figure 4C:
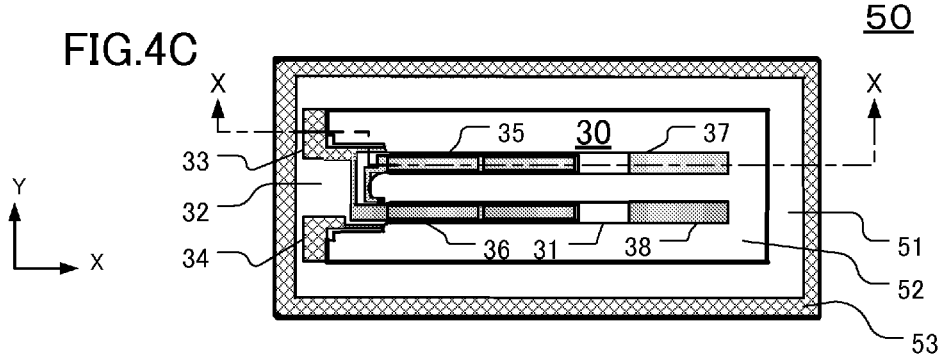
FIG. 4C is a top view of the crystal unit without the lid to show interior detail.
Figure 4D:
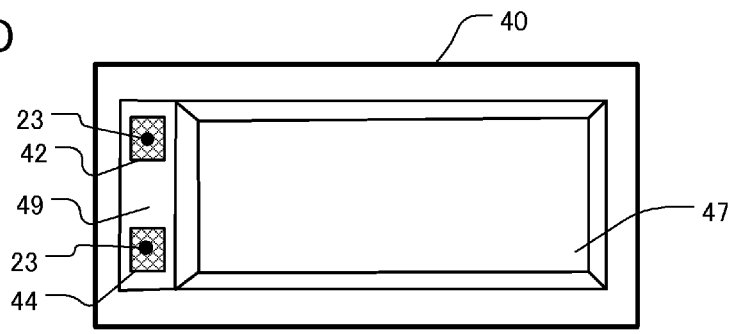
FIG. 4D is a plan view of the upper surface of a glass base used for packaging, the lid including a concave region and connection electrodes.
Figure 4E:
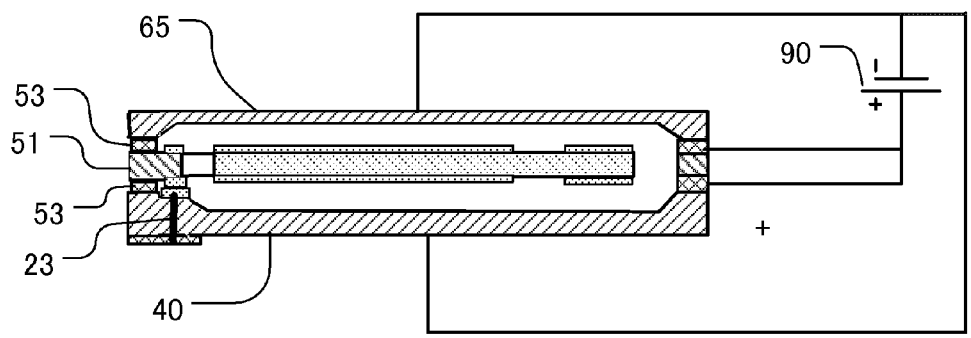
FIG. 4E is a schematic view showing a setup for performing anodic bonding.

A crystal unit 100 (as an exemplary piezoelectric device) according to this embodiment is shown in FIGS. 4A-4D, which are schematic views. FIG. 4A is an elevational section along the line X-X in FIG. 4C, FIG. 4B is a plan view of the under (inner) surface of the lid 65 of the package, FIG. 4C is a top (plan) view of the crystal frame 50, and FIG. 4D is a top (plan) view of the first base 40.

In FIG. 4A the crystal unit 100 includes a crystal frame 50 in which a tuning-fork type crystal vibrating piece 30 is situated centrally. A first base 40 is attached to the bottom surface of the crystal frame 50, and a first lid 65 is attached to the top surface of the crystal frame 50. In the crystal frame 50 the tuning-fork type crystal vibrating piece 30 was formed from a crystal wafer 10 by etching.

As FIG. 4B shows, the lid 65 has a lid concave portion 67 formed by etching of the surface of the first lid on the crystal-frame side thereof. The first lid 65 can be formed of Pyrex® glass, borosilicate glass, or sodium glass (hereinafter called the "lid glass wafer" 60).

As shown in FIG. 4C, the crystal frame 50 includes the so-called tuning-fork type crystal vibrating piece 30 located substantially centrally, and an outer frame 51 surrounding the piece 30, with a void 52 being defined between the tuning-fork crystal vibrating piece 30 and the outer frame 51. The void 52, which defines the outline of the tuning-fork type crystal vibrating piece 30, is formed by etching of the crystal material. The tuning-fork type crystal vibrating piece 30 comprises a base portion 32 and a pair of vibrating arms 31 extending horizontally from the base portion 32. The base portion 32 and the outer frame 51 are formed as a single unit. A first base electrode 33 and a second base electrode 34 are formed on a "first surface" (upper surface) of the base portion 32, on a "second surface" (lower surface) of the base portion, and on the outer frame 51.

On the first and second surfaces of the crystal vibrating piece 30, first and second excitation electrodes 35, 36, respectively, are formed. The first excitation electrode 35 is connected to the first base electrode 33 on the base portion 32 and the outer frame 51, and the second excitation electrode 36 is connected to the second base electrode 34 on the base portion 32 and the outer frame 51. Also, near the distal ends of the vibrating arms of the tuning-fork type crystal vibrating piece 30, respective "weights" 37, 38 are formed. The first and second base electrodes 33, 34, the first and second excitation electrodes 35, 36, and the weights 37, 38 are formed earlier using a process involving photolithography and etching. Whenever a voltage is applied to these electrodes, the arms of the tuning-fork type crystal vibrating piece 30 vibrate with a designated frequency. The weights 37, 38 facilitate ease of vibration of the vibrating arms 31 and adjustment of the vibration frequency.

Each of the upper and lower surfaces of the outer frame 51 comprises a metal film 53. The metal films 53 are formed by a sputtering or vacuum-deposition technique. Each metal film 53 desirably is a layer of aluminum (Al) having a thickness of approximately 1000-1500 Ångstroms.

In FIG. 4D the first base 40 is formed by etching of the surface of a base glass wafer 20 to form a base concave portion 47 and step portion 49. As described above, the ends of the two metal wires 23 are denuded and caused to protrude slightly from the first and second surfaces of the base glass wafer 20 by etching. At the areas where the metal wires 23 protrude, a first connection electrode 42 and a second connection electrode 44 are formed, respectively. The protruding wires 32 are easily bonded to the first and second connection electrodes 42, 44.

During assembly, the first connection electrode 42 overlaps and thus contacts the first base electrode 33, and the second connection electrode 44 overlaps and thus contacts the second base electrode 34 of the crystal vibrating piece 30. Since the first and second connection electrodes 42, 44, respectively, and the first and second base electrodes 33, 34 are layered, a space having a thickness substantially equal to the thickness of the respective stacked electrodes exists between the outer frame 51 and the crystal portion of the glass base 40. To reduce this space, the first and second connection electrodes 42, 44 are formed at the step portion 49, which is several hundred Ångstroms lower than the surface of the glass base 40.

The first and second connection electrodes 42, 44 of the first base 40 are formed using a method involving photolithography and etching. The first base 40 includes first and second external electrodes 45, 46 which are respective metalized regions on the lower surface of the first base 40. The first connection electrode 42 is connected to the first external electrode 45 (situated outside the first base 40) via a metal wire 23. Similarly, the second connection electrode 44 is connected to the second external electrode 46 (situated outside the first base 40) via a metal wire 23.

FIG. 4E is an elevational section schematically depicting the results of anodic bonding used for forming and sealing the package. The first lid 65 and the first base 40 are made of Pyrex® glass, borosilicate glass, or sodium glass, which are all glasses containing metal ions such as sodium ions. The outer frame 51 of the crystal frame 50 includes the metal film 53, which can be made of aluminum, on its upper and lower surfaces. The crystal frame 50, including the centrally located tuning-fork type crystal vibrating piece 30, is sandwiched between the first lid 65 having the lid concave portion 67 and the first base 40 having the base concave portion 47. Alternatively to aluminum, the metal film 53 can comprise a layer of gold formed on a base layer of chromium.

To form the layered package structure, the crystal frame 50, the first lid 65, and the first base 40 are heated up to a temperature of 200-400 C in a vacuum or inert-gas environment. The upper surface of the first lid 65 and the lower surface of the first base are set to a negative dc potential, and the metal films 53 of upper and lower surfaces of the outer frame 51 are set to a positive dc potential. Then, the crystal frame 50, first lid 65, and first base 40 are bonded together by anodic bonding including application, from a dc power source 90, of 400 Vdc for 10 minutes while the package is in a vacuum or inert-gas atmosphere. Anodic bonding causes the first and second base electrodes 33, 34 and first and second connection electrodes 42, 43 of the crystal unit 100 to be connected together tightly.

Anodic bonding involves chemical reactions that oxidize the metal on joint interfaces. To achieve anodic bonding, the metal film is temporarily used as a positive electrode while the surface facing the connecting surface of glass is temporarily used as a negative electrode, and an electrical field is impressed between these electrodes. The field causes metal ions such as sodium in the glass to move toward the negative electrode, which oxidizes the metal film contacting the glass material at the joint interface and causes bonding of the surfaces. In this embodiment, by way of example, the metal was Al and the contacting dielectrics were heated (200-400 C) while applying a dc voltage of 500 V to 1 kV, yielding chemical bonding (and thus sealing together) of the metal and glass at the joint interfaces.

Second Embodiment of Crystal Unit

Figure 5A:
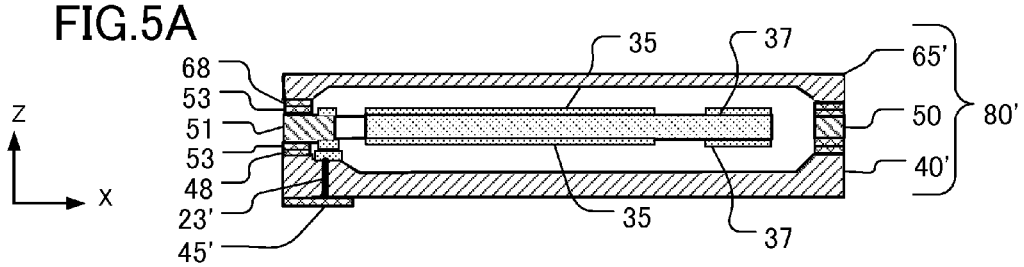
FIG. 5A is a schematic elevational section of a crystal unit according to a second embodiment.

A crystal unit 110 according to this embodiment is described with reference to the schematic views shown in FIGS. 5A-5D. FIG. 5A is an elevational section along the line X-X in FIG. 5C, FIG. 5B is a plan view of the lower (inner) surface of the second lid 65', FIG. 5C is a top plan view of the crystal frame 50, and FIG. 5D is a top view of the second base 40'.

In FIG. 5A the crystal unit 110 comprises a crystal frame 50 of which a tuning-fork type crystal vibrating piece 30 is a central portion. A second base 40' is attached to the lower surface of the crystal frame 50 and a second lid 65' is attached to the upper surface of the crystal frame 50.

Figure 5B:
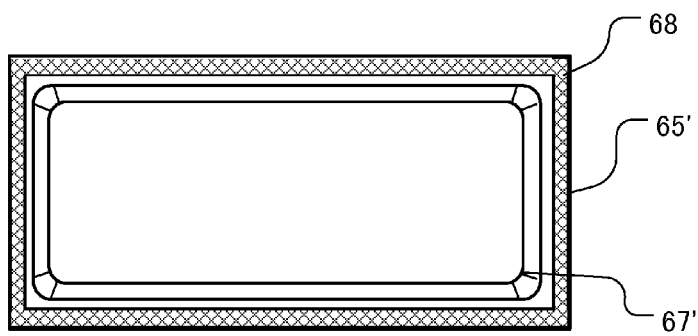
FIG. 5B is a plan view of the under-surface of a lid used for packaging, the lid including a concave region.

Turning to FIG. 5B, the second lid 65' includes a lid concave portion 67' formed on the under-surface thereof. This under-surface will be situated inside the completed package. The lid concave portion 67' is formed by etching of the lid material to a defined depth. The under-surface of the second lid 65' also includes a metal film 68 having substantially the same shape and composition as of the metal film 53 formed on the outer frame 51 of the crystal frame 50 (made of, e.g., a gold layer on a base chrome layer). The second lid 65' can be made from a lid glass wafer made of, for example, Pyrex® glass, borosilicate glass, or sodium glass.

Figure 5C:
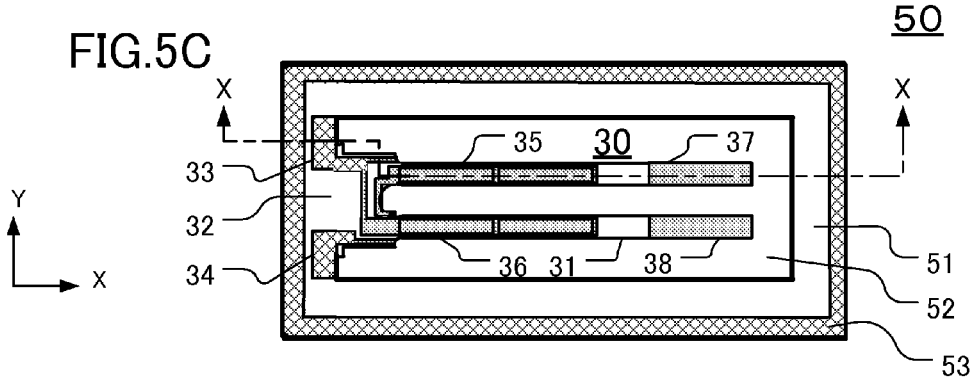
FIG. 5C is a top view of the crystal unit without the lid to show interior detail.
Figure 5D:
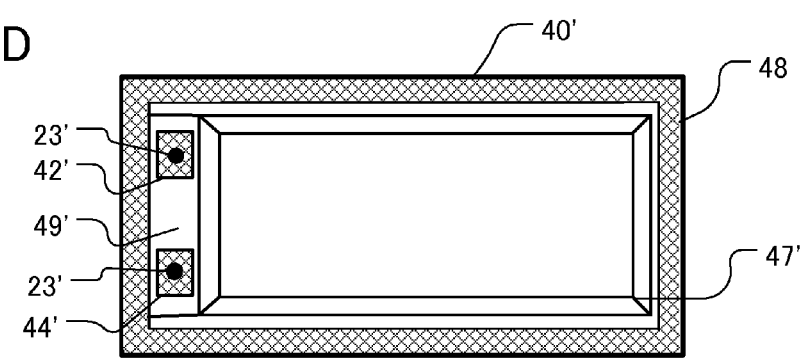
FIG. 5D is a plan view of the upper surface of a glass base used for packaging, the lid including a concave region and connection electrodes.

As shown in FIG. 5C, the crystal frame 50 includes a so-called tuning-fork type crystal vibrating piece 30 centrally located and surrounded by an outer frame 51. Between the tuning-fork crystal vibrating piece 30 and the outer frame 51 is a void 52. The crystal vibrating piece 30 has substantially the same configuration and electrodes as in the first embodiment (FIG. 4C); consequentially, components of the second embodiment that are similar to corresponding components in the first embodiment have the same respective reference numerals and are not described further.

A metal film 53 is formed on the upper and lower surfaces of the outer frame 51. The metal film 53 can be formed by a sputtering or vacuum-deposition technique. In this embodiment the metal film 53 comprises a gold layer on a chromium base layer. Alternatively, the metal film 53 can comprise a layer of gold or silver on a base layer of nickel (Ni) or titanium (Ti). With respect to a chromium-gold metal film, by way of example, the thickness of the chromium layer is in the range of approximately 500-1000 Ångstroms, and the thickness of the gold layer is approximately 500-1500 Ångstroms.

In FIG. 5D the second base 40' is formed from a base glass wafer 20 and has base concave portion 47' formed by etching of the first surface (upper surface) facing the crystal frame 50. As a result of etching of the base glass wafer, the denuded ends of the at least two metal wires 23' protrude slightly from the surface of the second base 40. Where the metal wires 23' protrude, a first connection electrode 42' and second connection electrode 44' are formed. The protrusion of the metal wires 23' simplifies connection thereto of the first and second connection electrodes 42', 44'.

Also formed on the upper surface of the second base 40' is a metal film 48 having substantially the same shape as of the metal film 53 formed on the lower surface of the outer frame 51 of the crystal frame 50.

As they overlap each other, the first connection electrode 42' contacts the first base electrode 33, and the second connection electrode 44' contacts the second base electrode 34 of the crystal vibrating piece 30. As a result of the layered configurations of the first and second connection electrodes 42', 44' and of the first and second base electrodes 33, 34, a space having the thickness of an electrode exists between the outer frame 51 and the crystal portion of the glass base 40. To narrow this space, the first and second connection electrodes 42', 44' are formed on a step portion 49 that is several hundred Ångstroms lower than the first surface of the glass base 40.

The gold layer of the second lid 65' and the gold layer of the metal film 53 formed on the upper surface of the outer frame 51 of the crystal frame 50 are multi-layered films, as are the gold layer of the second base 40' and the gold layer of the metal layer 53 formed on the lower surface of the outer frame 51 of the crystal frame 50. When these multi-layered structures are impressed at high temperature (e.g., 300 C) in a chamber in which the environment is a vacuum or inert gas, the metals become bonded. As a result of this bonding method, the interior of the package 80 of the crystal unit 110 is either a vacuum or filled with an inert gas.

At the time at which the second base 40' and the crystal frame 50 are bonded together, the first and second base electrodes 33, 34, formed on the second main surface of the outer frame 51, are connected to the first and second connection electrodes 42', 44, respectively, on the second base 40'.

Figure 6A:
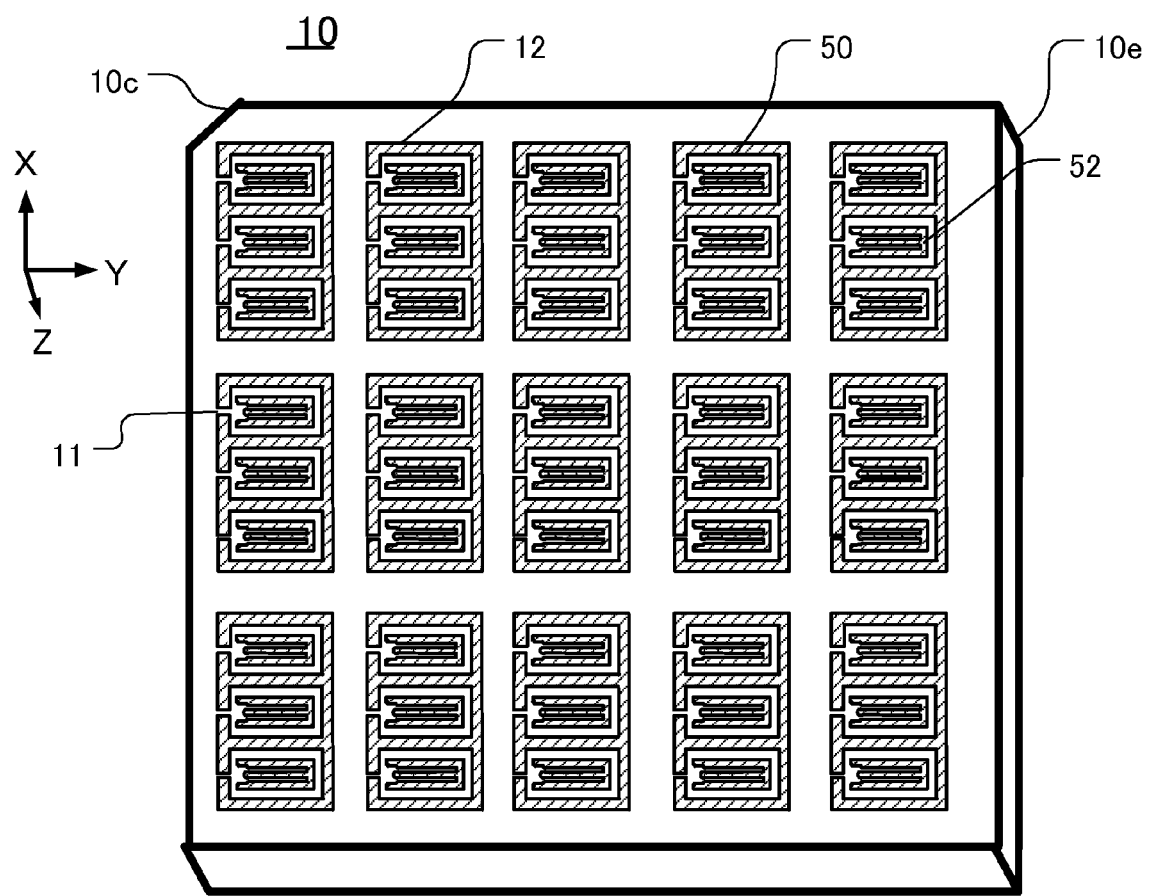
FIG. 6A is a schematic perspective view of a crystal wafer 10 on which are formed multiple crystal frames and respective tuning-fork type crystal vibrating pieces.

Process for Manufacturing Crystal Frames and Tuning-Fork Type Crystal Vibrating Pieces FIG. 6A is a schematic perspective view of an upper surface of a crystal wafer 10 on which multiple tuning-fork type crystal vibrating pieces 30 have been formed. As understood from FIG. 6A, the tuning-fork type crystal vibrating pieces 30 and crystal frames 50 are formed at the same time by etching a square crystal wafer 10. More specifically, the shaded regions in the figure are etched away, forming corresponding voids 12, 52. Thus, the tuning-fork type crystal vibrating pieces 30 and their crystal frames 50 are defined on the wafer 10. FIG. 6A shows, by way of example, fifteen blocks arranged on the wafer, wherein each block includes three respective tuning-fork type crystal vibrating pieces 30 each with its respective crystal frame 50. To define an axial direction of the square crystal wafer 10, an orientation flat 10c defining the crystal-lattice direction is formed at the appropriate region of the periphery 10e of the crystal wafer 10. In FIG. 6A forty-five tuning-fork type crystal vibrating pieces 30 are shown on the crystal wafer 10 for ease of illustration;

on an actual crystal wafer 10, hundreds or thousands of tuning-fork crystal vibrating pieces 30 are typically formed.

In FIG. 6A, the tuning-fork type crystal vibrating pieces 30 are still attached to their respective crystal frames 50, and the crystal frames 50 are still attached to the crystal wafer 10. The crystal wafer 10 with all these attached structures can be processed as a unit rather than having to process individual crystal vibrating pieces in their respective frames.

Figure 6B:
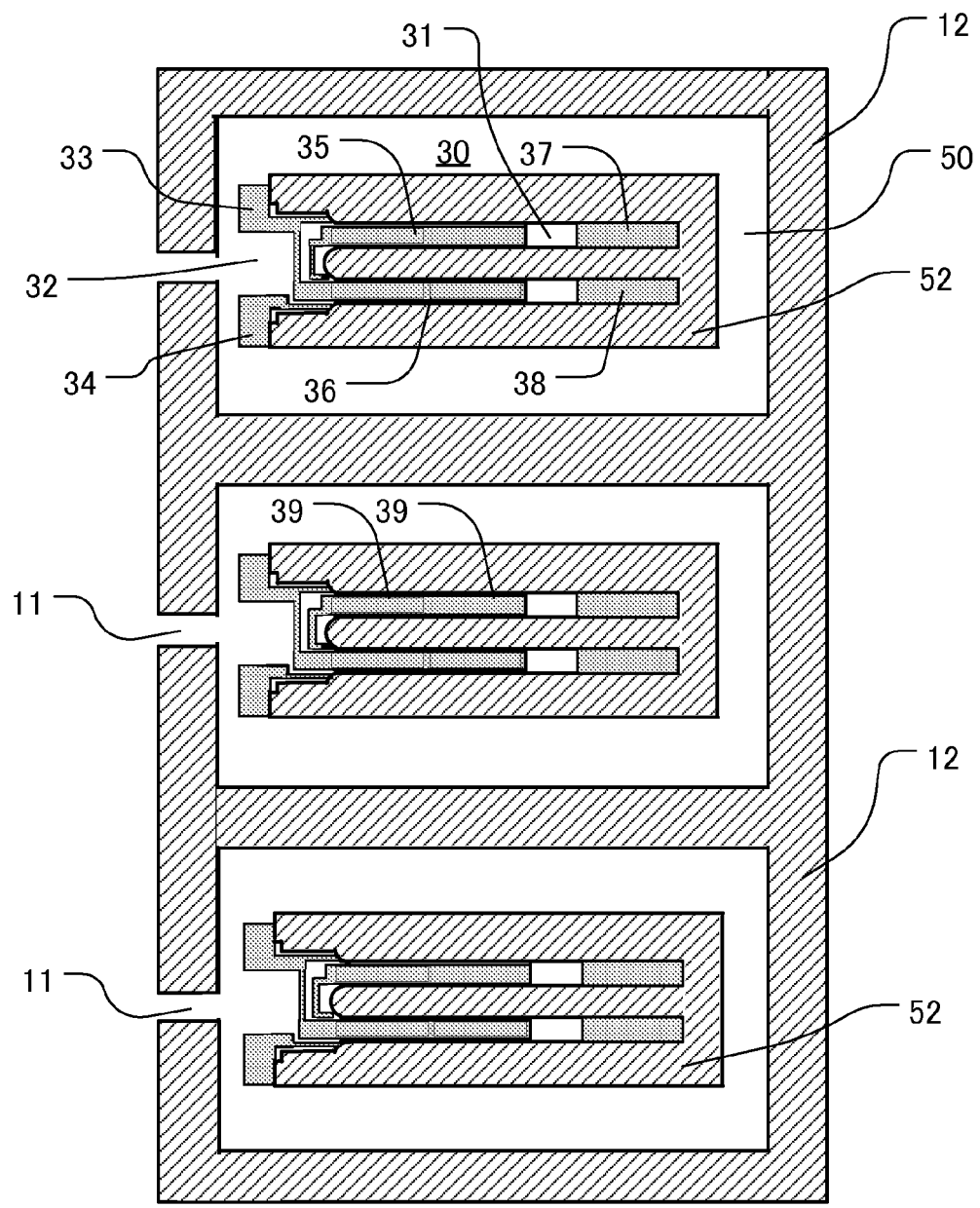
FIG. 6B is an enlarged plan view of three crystal frames on the crystal wafer of FIG. 6A.

FIG. 6B is an enlarged plan view of a block comprising three tuning-fork type crystal vibrating pieces 30 and their respective crystal frames 50. The hatched regions 12, 52 are actually etched away, forming respective through-voids in the crystal wafer 10. The remaining structures in the block are the tuning-fork type crystal vibrating pieces 30 and their respective crystal frames 50. Respective connecting portions 11 are situated on a portion of the periphery of the crystal frame 50, connecting the frames 50 and their respective pieces 30 to the crystal wafer 10. By thus connecting the various structures together on one wafer, multiple crystal frames 50 and crystal vibrating pieces 30 can be manipulated and processed at one time by manipulating and processing the entire crystal wafer 10.

The respective first and second base electrodes 33, 34, first and second excitation electrodes 35, 36, and weights 37, 38 are formed on the crystal vibrating pieces 30 while the pieces are still attached to the crystal wafer 10. Also formed are groove regions 39 on the pairs of vibrating arms 31 extending from the base 32. The first and second excitation electrodes 35, 36 are formed in the groove regions 39 to lower the CI (crystal impedance) value of the pieces 30. The first and second base electrodes 33, 34, the first and second excitation electrodes 35, 36, and the weights 37, 38 on the tuning-fork type crystal vibrating piece 30 are formed by photolithography and etching steps performed after forming respective metal films by sputtering or vacuum-deposition. Particularly, metal films comprising a layer of gold or silver on a base layer of chrome, nickel, or titanium are formed by sputtering for use as base electrodes. In such an embodiment, the thickness of the chrome layer is 500-1000 Ångstroms, and the thickness of the gold layer is 500-1000 Ångstroms. Hence, the total thickness of each of the first and second base electrodes 33, 34 and of the first and second excitation electrodes 35, 36 is 1500-2000 Ångstroms.

Method for Manufacturing Crystal Unit

Figure 7:
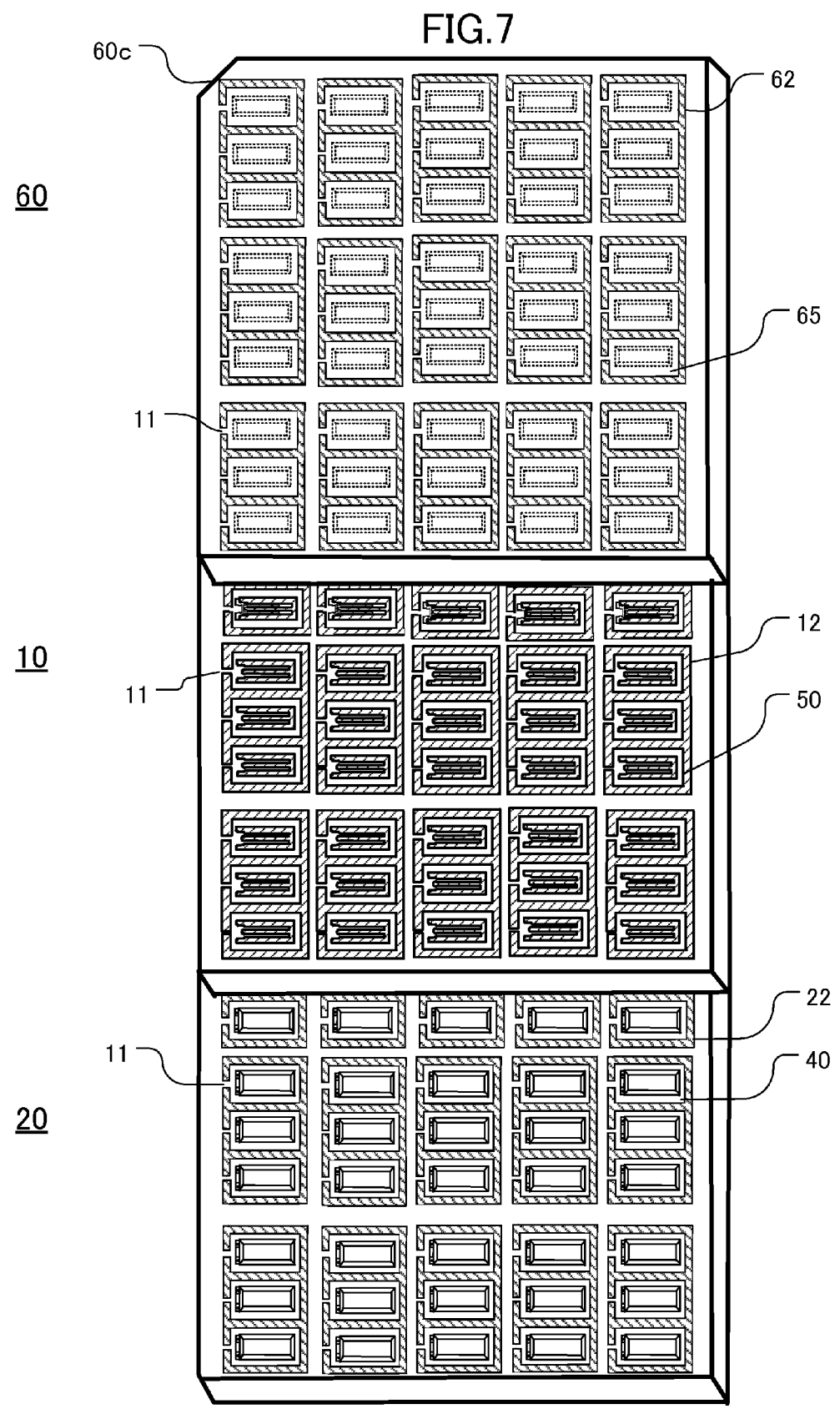
FIG. 7 is a schematic perspective view showing a lid glass wafer (on which multiple first lids are formed), a crystal wafer (on which multiple tuning-fork type crystal vibrating pieces and their crystal frames are formed), and a base glass wafer (on which multiple first bases are formed). For simultaneous manufacture of multiple crystal units, these wafers are stacked in registration to form a wafer sandwich.

FIG. 7 depicts the results of three different steps in an embodiment of a method for manufacturing crystal units (as exemplary piezoelectric devices). The upper frame of FIG. 7 shows a lid glass wafer 60 on which multiple first lids 65 have been formed. The middle frame of FIG. 7 shows a crystal wafer 10 on which multiple tuning-fork type crystal vibrating pieces 30 and their respective crystal frames 50 have been formed. The lower frame of FIG. 7 shows a base glass wafer 20 on which multiple first bases 40 have been formed. Similar to the crystal vibrating pieces 30 connected to the crystal wafer 10, the first lids 65 and first bases 40 are connected to the lid glass wafer 60 and base glass wafer 20, respectively, by connecting portions 11. For simultaneous assembly of multiple crystal units, the wafers 60, 10, 20 are registered with each other and layered superposedly with respect to each other so that all the bases 40 are registered with respective crystal vibrating pieces 30, and all the crystal vibrating pieces 30 are registered with respective lids 65.

In preparation for simultaneous assembly, the first lids 65 include downward-facing concave portions 67 that have been formed by etching. The first bases 40 include upward-facing lid concave portions 47 that have been formed by etching and also include the first and second connection electrodes 42, 44.

As described in connection with FIGS. 6A and 6B, the tuning-fork type crystal vibrating pieces 30 include the first and second base electrodes 33, 34 and first and second excitation electrodes 35, 36.

By way of example, the lid glass wafer 60, the base glass wafer 20, and the crystal wafer 10 are each four inches on a side. Since each wafer includes a respective orientation flat 60c, 20c, 10c, the three wafers can be accurately positioned for layering atop one another to form a three-wafer sandwich in which all the components 65, 30, 40 are registered with each other in a manner that will simultaneously form multiple crystal units. After forming the sandwich, the wafers are anodically bonded together in a vacuum chamber or in an inert gas environment. During the anodic bonding, in each crystal unit thus formed, the first and second base electrodes 33, 34 are bonded tightly to the first and second connection electrodes 42, 44.

After bonding together the layered lid glass wafer 60, base glass wafer 20, and crystal wafer 10, the connecting portions 11 are broken in common to release each crystal unit from the wafer sandwich. This step completes the simultaneous formation of the multiple crystal units 100. This process achieves electrode connections and the bonding together of piezoelectric vibrating pieces and their package components all at the same time for the multiple crystal units of the wafer sandwich. Also, the process advantageously can be performed all in a wafer-manufacturing unit so that productivity is improved. Note that the crystal units 110 of the second embodiment also can be manufactured simultaneously in a wafer-manufacturing unit.

Representative embodiments are described above. It will be understood that these embodiments can be modified or changed while not departing from the spirit and scope of them and/or of the appended claims.

Also, although the embodiments have been described in the context of tuning-fork type crystal vibrating pieces 30, it will be understood that the subject methods, for example, can be applied to AT vibrating devices and SAW elements.

What is claimed is:

1. A piezoelectric device, comprising:
a piezoelectric vibrating piece comprising at least first and second electrodes;
a glass base having opposing first and second surfaces, the first surface being sealingly bonded to an under-surface of the piezoelectric vibrating piece; and
a lid sealingly bonded to an upper surface of the piezoelectric vibrating piece such that the piezoelectric vibrating piece is sandwiched between the base and lid;
wherein the glass base comprises at least first and second metal wires extending through the thickness of the glass base, the wires having denuded ends protruding from the first and second surfaces, respectively, such that the ends protruding from the first surface are connected to the first and second electrodes, and the ends protruding from the second surface are connected to respective first and second external electrodes of the device.

2. The piezoelectric device of claim 1, wherein the ends of the first and second wires are connected to respective connection electrodes on the base.

3. The piezoelectric device of claim 2, wherein the at least first and second wires have a surface roughness that is increased to enhance affinity of the wires for the glass base.

4. The piezoelectric device of claim 2, wherein the at least first and second metal wires are made from a metal selected from the group consisting of iron (Fe), copper (Cu), nickel (Ni), stainless (SUS), and kovar alloy.

5. The piezoelectric device of claim 4, wherein each of the at least first and second wires includes a surficial layer of gold (Au).

6. The piezoelectric device of claim 5, wherein the at least first and second wires have a surface roughness that is increased to enhance affinity of the wires for the glass base.

7. The piezoelectric device of claim 1, wherein the at least first and second metal wires are made from a metal selected from the group consisting of iron (Fe), copper (Cu), nickel (Ni), stainless (SUS), and kovar alloy.

8. The piezoelectric device of claim 7, wherein each of the at least first and second wires includes a surficial layer of gold (Au).

9. The piezoelectric device of claim 8, wherein the at least first and second wires have a surface roughness that is increased to enhance affinity of the wires for the glass base.

10. The piezoelectric device of claim 7, wherein the at least first and second wires have a surface roughness that is increased to enhance affinity of the wires for the glass base.

11. The piezoelectric device of claim 1, wherein the at least first and second wires have a surface roughness that is increased to enhance affinity of the wires for the glass base.

12. A surface-mountable piezoelectric device, comprising:
a piezoelectric vibrating piece comprising opposing first and second major surfaces and at least first and second base electrodes;
a glass base comprising opposing first and second major surfaces and a step portion, the second major surface of the base being a lower outer surface of the device, the first major surface of the base being sealingly bonded to the second major surface of the piezoelectric vibrating piece, the step portion having a surface that is lower than the first major surface of the base, the base further comprising at least first and second external electrodes situated on the second major surface of the base, the base further comprising first and second connecting electrodes corresponding to the first and second base electrodes and being situated on the surface of the step portion; and
a lid comprising opposing first and second major surfaces, the first major surface of the lid being an upper outer surface of the device, the second major surface of the lid being sealingly bonded to the second major surface of the piezoelectric vibrating piece such that the piezoelectric vibrating piece is sandwiched between the base and lid;
the base further comprising at least first and second metal wires extending through the thickness of the base, the wires having respective denuded ends protruding from the first and second major surfaces, respectively, of the base such that the denuded ends protruding from the first major surface are connected to the first and second connecting electrodes, respectively, and the denuded ends protruding from the second major surface are connected to respective first and second external electrodes.

* * * * *

UNITED STATES PATENT AND TRADEMARK OFFICE
CERTIFICATE OF CORRECTION

PATENT NO.         : 8,063,542 B2
APPLICATION NO.    : 12/237301
DATED              : November 22, 2011
INVENTOR(S)        : Kozo Ono and Takahiro Inoue It is certified that error appears in the above-identified patent and that said Letters Patent is hereby corrected as shown below:

In the Specification

Column 6, line 6, "($Na_2B_4O_7$ $10H_2O$)" should read --($Na_2B_4O_7 \cdot 10H_2O$)- -

Column 6, line 41, "65° C" should read --650 C- -

Signed and Sealed this
Twenty-fourth Day of September, 2013

Teresa Stanek Rea
*Deputy Director of the United States Patent and Trademark Office*